United States Patent
Tanabe et al.

(10) Patent No.: US 9,846,361 B2
(45) Date of Patent: Dec. 19, 2017

(54) PHOTOSENSITIVE CONDUCTIVE PASTE, MULTILAYER SUBSTRATE, METHOD OF PRODUCING CONDUCTIVE PATTERN, AND ELECTROSTATIC CAPACITANCE TYPE TOUCH PANEL

(71) Applicant: Toray Industries, Inc., Tokyo (JP)

(72) Inventors: Miharu Tanabe, Otsu (JP); Kazutaka Kusano, Otsu (JP)

(73) Assignee: Toray Industries, Inc. (JP)

( * ) Notice: Subject to any disclaimer, the term of this patent is extended or adjusted under 35 U.S.C. 154(b) by 0 days.

(21) Appl. No.: 14/439,705

(22) PCT Filed: Oct. 31, 2013

(86) PCT No.: PCT/JP2013/079622
§ 371 (c)(1),
(2) Date: Apr. 30, 2015

(87) PCT Pub. No.: WO2014/077136
PCT Pub. Date: May 22, 2014

(65) Prior Publication Data
US 2015/0248053 A1    Sep. 3, 2015

(30) Foreign Application Priority Data

Nov. 13, 2012  (JP) .................. 2012-249141

(51) Int. Cl.

| | | |
|---|---|---|
| G06F 3/044 | (2006.01) | |
| G06F 3/0488 | (2013.01) | |
| G03F 7/038 | (2006.01) | |
| H01B 1/22 | (2006.01) | |
| H05K 3/02 | (2006.01) | |
| G03F 7/004 | (2006.01) | |
| G03F 7/40 | (2006.01) | |
| H05K 1/09 | (2006.01) | |
| H05K 3/46 | (2006.01) | |

(52) U.S. Cl.
CPC ............ *G03F 7/038* (2013.01); *G03F 7/0047* (2013.01); *G03F 7/40* (2013.01); *G06F 3/044* (2013.01); *H01B 1/22* (2013.01); *H05K 3/02* (2013.01); *G06F 2203/04103* (2013.01); *H05K 1/095* (2013.01); *H05K 3/4664* (2013.01); *H05K 2203/0514* (2013.01)

(58) Field of Classification Search
CPC .......... G06F 3/044; G06F 3/0488; G03F 7/40; G03F 7/0388
See application file for complete search history.

(56) References Cited

U.S. PATENT DOCUMENTS

| | | | |
|---|---|---|---|
| 2014/0030658 A1* | 1/2014 | Kuroki | ............... C23C 18/1216 430/319 |
| 2015/0050586 A1* | 2/2015 | Mizuguchi | .............. G03F 7/038 430/18 |
| 2015/0056560 A1* | 2/2015 | Mizuguchi | .............. G03F 7/027 430/325 |
| 2015/0177622 A1* | 6/2015 | Horiuchi | ............ B01D 19/0052 430/331 |

FOREIGN PATENT DOCUMENTS

| | | |
|---|---|---|
| JP | 2654066 B2 | 9/1997 |
| JP | 10-64333 | 3/1998 |
| JP | 2003-104755 | 4/2003 |
| JP | 2005-267859 | 9/2005 |
| JP | 2009-245704 | 10/2009 |
| JP | 2011-180580 | 9/2011 |
| JP | 2012014015 A * | 1/2012 |
| JP | 2012-169072 | 9/2012 |
| JP | 2012-203355 | 10/2012 |
| TW | 201234391 | 8/2012 |
| TW | 201238986 | 10/2012 |

* cited by examiner

*Primary Examiner* — Ricardo L Osorio
(74) *Attorney, Agent, or Firm* — DLA Piper LLP (US)

(57) ABSTRACT

A photosensitive conductive paste contains conductive particles (A), a photosensitive organic compound (B), an epoxy resin (C) and an ion adsorbent (D) that is selected from the group consisting of hydrotalcite, magnesium oxide, aluminum oxide, aluminum hydroxide, magnesium hydroxide, magnesium carbonate, zirconium oxide, magnesium silicate, silicon dioxide, zeolite and a carbon-based powder.

18 Claims, No Drawings ance type touch panel.

PHOTOSENSITIVE CONDUCTIVE PASTE, MULTILAYER SUBSTRATE, METHOD OF PRODUCING CONDUCTIVE PATTERN, AND ELECTROSTATIC CAPACITANCE TYPE TOUCH PANEL

TECHNICAL FIELD

This disclosure relates to a photosensitive conductive paste, a multilayer substrate, a method of producing a conductive pattern, and an electrostatic capacit

BACKGROUND

A so-called "conductive paste" with a large amount of a particulate silver flakes, copper powder, or carbon particles mixed in a resin or an adhesive has come into practical use. Many of polymer-type conductive pastes put into practical use form a pattern by a screen printing method and heating and curing the pattern to form a conductive pattern (see Japanese Patent Publication No. 2654066 and Japanese Patent Laid-open Publication No. 2005-267859), but it is difficult to accurately draw a fine pattern.

Thus, to enhance fineness of a pattern, a conductive paste capable of being etched (Japanese Patent Laid-open Publication No. 10-064333) has been developed and, further, a photosensitive paste that forms a conductive pattern has been developed which is capable of exhibiting conductivity at a relatively low temperature and which is capable of forming an organic-inorganic composite conductive pattern having a low resistivity on a flexible substrate such as a film (Japanese Patent Laid-open Publication No. 2011-180580).

However, to form a pattern by a photolithography method using the conventional conductive paste capable of being etched, further, a resist layer must be formed on a coating film of the conductive paste, leading to the problem that the production process of a conductive pattern is complicated. The conventional photosensitive paste that forms a conductive pattern often contains excessive ion components derived from a raw material of the paste or generated or mixed during production of a conductive pattern, and there are the problems that materials such as a substrate are degraded, and that adhesion of the produced conductive film to the substrate is reduced.

Thus, it could be helpful to provide a photosensitive conductive paste capable of fine patterning and exhibition of conductivity at a low temperature without adversely affecting materials such as a substrate, and also capable of forming a conductive pattern having a low resistivity and excellent adhesion to the substrate; and a method of producing a conductive pattern using the photosensitive conductive paste.

SUMMARY

We thus provide a photosensitive conductive paste, a multilayer substrate, and a method of producing a conductive pattern as set forth in (1) to (5) below.

(1) A photosensitive conductive paste including: conductive particles A; a photosensitive organic compound B; an epoxy resin C; and an ion adsorbent D selected from the group consisting of hydrotalcite, magnesium oxide, aluminum oxide, aluminum hydroxide, magnesium hydroxide, magnesium carbonate, zirconium oxide, magnesium silicate, silicon dioxide, zeolite, and a carbon-based powder.

(2) The photosensitive conductive paste according to (1), wherein the conductive particles A are noble metal particles.

(3) A multilayer substrate including a conductive layer formed from the photosensitive conductive paste according to (1) or (2).

(4) A method of producing a conductive pattern, the method including: an application step of applying the photosensitive conductive paste according to (1) or (2) onto a substrate to obtain a coating film; a drying step of drying the coating film; an exposure step of exposing the dried coating film; a development step of developing the exposed coating film to obtain a pattern; and a heating step of heating the pattern to obtain a conductive pattern.

(5) An electrostatic capacitance type touch panel including as peripheral wiring the conductive pattern formed from the photosensitive conductive paste according to (1) or (2), wherein the peripheral wiring has a pitch of 100 μm or less.

According to a photosensitive conductive paste, fine patterning and exhibition of conductivity at a low temperature can be achieved while materials such as a substrate are not adversely affected. A conductive pattern having a low resistivity and excellent adhesion to the substrate can be formed.

DETAILED DESCRIPTION

Our photosensitive conductive paste includes: conductive particles A; a photosensitive organic compound B; an epoxy resin C; and an ion adsorbent D selected from the group consisting of magnesium oxide, aluminum oxide, aluminum hydroxide, magnesium hydroxide, magnesium carbonate, zirconium oxide, magnesium silicate, silicon dioxide, zeolite, and a carbon-based powder. The paste can be given a desired function when heated after being applied onto a substrate, and dried to remove a solvent.

Our method of producing a conductive pattern includes: an application step of applying the photosensitive conductive paste onto a substrate to obtain a coating film; a drying step of drying the coating film; an exposure step of exposing the dried coating film; a development step of developing the exposed coating film to obtain a pattern; and a heating step of heating the pattern to obtain a conductive pattern. The conductive pattern obtained by the method of producing a conductive pattern exhibits conductivity as conductive particles A contained in the photosensitive conductive paste come into contact with one another due to shrinkage on curing during heating.

Examples of the conductive particles A include particles of Ag, Au, Cu, Pt, Pb, Sn, Ni, Al, W, Mo, Sb, ruthenium oxide, Cr, Ti, and indium or alloys of these metals, or mixtures of these particles, but particles of Ag, Au, and Pt that are noble metals, and Cu are preferred from the viewpoint of conductivity, particles of noble metals are more preferred from the viewpoint of stability, and particles of Ag are further preferred from the viewpoint of a cost. Cu is excellent in terms of a cost, but a part thereof is apt to form Cu ions and, therefore, not only conductivity is reduced, but also when an ion adsorbent is added, the ion adsorbent is consumed for adsorption of Cu ions so that efficiency of adsorption of other ions that adversely affect materials such as a substrate may be reduced.

The volume average particle size of the conductive particles A is preferably 0.5 to 10 μm, more preferably 1 to 6 μm. When the volume average particle size is 1 μm or more, the contact probability between conductive fillers in the heating step increases, and the resistivity and breakage probability of the produced conductive pattern decrease.

Further, in the exposure step, exposure light can smoothly pass through a coating film obtained by applying the photosensitive conductive paste so that fine patterning is facilitated. On the other hand, when the volume average particle size is 6 μm or less, the surface smoothness, pattern accuracy and dimensional accuracy of the produced conductive pattern are improved. The volume average particle size can be measured by a Coulter counter method.

The added amount of the conductive particles A is preferably 70 to 95% by weight, more preferably 80 to 90% by weight based on the total solid content in the photosensitive conductive paste. When the added amount of the conductive particles A is 80% by weight or more based on the total solid content, the contact probability of conductive particles A in shrinkage on curing in the heating step increases, and resistivity and breakage probability of the produced conductive pattern decrease. On the other hand, when the added amount of the conductive particles A is 90% by weight or less based on the total solid content, in the exposure step, exposure light can smoothly pass through a coating film obtained by applying the photosensitive conductive paste so that fine patterning is facilitated. The total solid content refers to all constituents of the photosensitive conductive paste excluding the solvent.

The photosensitive organic compound B refers to a monomer, an oligomer or a polymer which contains an unsaturated double bond in the molecule. More specifically, the photosensitive organic compound B is, for example, an acryl-based copolymer. The acryl-based copolymer refers to a copolymer containing as a copolymerization component an acryl-based monomer having a carbon-carbon double bond. As the acryl-based monomer, acryl-based monomers such as methyl acrylate, acrylic acid, 2-ethylhexyl acrylate, ethyl methacrylate, n-butyl acrylate, i-butyl acrylate, i-propane acrylate, glycidyl acrylate, N-methoxymethylacrylamide, N-ethoxymethylacrylamide, N-n-butoxymethylacrylamide, N-isobutoxymethylacrylamide, butoxytriethylene glycol acrylate, dicyclopentanyl acrylate, dicyclopentenyl acrylate, 2-hydroxyethyl acrylate, isobornyl acrylate, 2-hydroxypropyl acrylate, isodecyl acrylate, isooctyl acrylate, lauryl acrylate, 2-methoxyethyl acrylate, methoxyethylene glycol acrylate, methoxydiethylene glycol acrylate, octafluoropentyl acrylate, phenoxyethyl acrylate, stearyl acrylate, trifluoroethyl acrylate, acrylamide, aminoethyl acrylate, phenyl acrylate, phenoxyethyl acrylate, 1-naphthyl acrylate, 2-naphthyl acrylate, thiophenol acrylate, and benzyl mercaptan acrylate, or compounds with acrylic groups of the above-mentioned acryl-based monomers replaced by methacrylic groups, styrenes such as styrene, p-methylstyrene, o-methylstyrene, m-methylstyrene, α-methylstyrene, chloromethylstyrene and hydroxymethylstyrene, γ-methacryloxypropyl trimethoxysilane, and 1-vinyl-2-pyrrolidone are preferred.

Preferably, the photosensitive conductive paste contains a photopolymerization initiator. The photopolymerization initiator refers to a compound which is decomposed by an ultraviolet ray or an infrared ray to generate a radical or an acid. Examples of the photopolymerization initiator include 1,2-octanedione, 1-[4-(phenylthio)-2-(O-benzoyloxime)], 2,4,6-trimethylbenzoyl-diphenyl-phosphine oxide, bis(2,4,6-trimethylbenzoyl)-phenyl-phosphine oxide, ethanone, 1-[9-ethyl-6-2(2-methylbenzoyl)-9H-carbazole-3-yl]-1-(O-acetyloxime), benzophenone, methyl o-benzoylbenzoate, 4,4'-bis(dimethylamino)benzophenone, 4,4'-bis(diethylamino)benzophenone, 4,4'-dichlorobenzophenone, 4-benzoyl-4'-methyldiphenylketone, dibenzylketone, fluorenone, 2,2'-diethoxyacetophenone, 2,2-dimethoxy-2-phenylacetophenone, 2-hydroxy-2-methylpropiophenone, p-t-butyldichloroacetophenone, thioxanthone, 2-methylthioxanthone, 2-chlorothioxanthone, 2-isopropylthioxanthone, diethylthioxanthone, benzyl, benzyl dimethyl ketal, benzyl-β-methoxyethyl acetal, benzoin, benzoin methyl ether, benzoin butyl ether, anthraquinone, 2-t-butylanthraquinone, 2-amylanthraquinone, β-chloroanthraquinone, anthrone, benzanthrone, dibenzosuberone, methylene anthrone, 4-azidebenzalacetophenone, 2,6-bis(p-azidebenzylidene)cyclohexanone, 6-bis(p-azidebenzylidene)-4-methylcyclohexanone, 1-phenyl-1,2-butanedione-2-(o-methoxycarbonyl)oxime, 1-phenyl-propanedione-2-(o-ethoxycarbonyl)oxime, 1-phenyl-propanedione-2-(o-benzoyl)oxime, 1,3-diphenyl-propanetrione-2-(o-ethoxycarbonyl)oxime, 1-phenyl-3-ethoxy-propanetrione-2-(o-benzoyl)oxime, Michler's ketone, 2-methyl-[4-(methylthio)phenyl]-2-morpholino-1-propanone, naphthalenesulfonyl chloride, quinolinesulfonyl chloride, N-phenylthioacridone, 4,4'-azobisisobutyronitrile, diphenyl disulfide, benzothiazole disulfide, triphenylphosphine, camphor quinone, carbon tetrabromide, tribromophenylsulfone, benzoyl peroxide, and combinations of a photo-reductive pigment such as eosin and methylene blue, and a reducing agent such as ascorbic acid and triethanolamine.

The added amount of the photopolymerization initiator is preferably 0.05 to 30 parts by weight, more preferably 5 to 20 parts by weight based on 100 parts by weight of the photosensitive organic compound B and epoxy resin C. When the added amount of the photopolymerization initiator is 5 parts by weight or more based on 100 parts by weight of the photosensitive organic compound B and epoxy resin C, the curing density of an exposed part of the photosensitive conductive paste increases so that the residual film ratio after developing increases. On the other hand, when the added amount of the photopolymerization initiator is 20 parts by weight or less based on 100 parts by weight of the photosensitive organic compound B and epoxy resin C, excessive absorption of light by the photopolymerization initiator at the upper part of a coating film obtained by applying the photosensitive conductive paste is suppressed. As a result, the produced conductive pattern is inhibited from being reversely tapered to reduce adhesion to the substrate.

The photosensitive conductive paste may contain a sensitizer along with the photopolymerization initiator.

Examples of the sensitizer include 2,4-diethylthioxanthone, isopropylthioxanthone, 2,3-bis(4-diethylaminobenzal)cyclopentanone, 2,6-bis(4-dimethylaminobenzal)cyclohexanone, 2,6-bis(4-dimethylaminobenzal)-4-methylcyclohexanone, Michler's ketone, 4,4-bis(diethylamino)benzophenone, 4,4-bis(dimethylamino) chalcone, 4,4-bis(diethylamino)chalcone, p-dimethylaminocinnamylideneindanone, p-dimethylaminobenzylideneindanone, 2-(p-dimethylaminophenylvinylene) isonaphthothiazole, 1,3-bis(4-dimethylaminophenylvinylene)isonaphthothiazole, 1,3-bis(4-dimethylaminobenzal) acetone, 1,3-carbonylbis(4-diethylaminobenzal)acetone, 3,3-carbonylbis(7-diethylaminocoumarin), N-phenyl-N-ethylethanolamine, N-phenylethanolamine, N-tolyldiethanolamine, isoamyl dimethylaminobenzoate, isoamyl diethylaminobenzoate, 3-phenyl-5-benzoylthiotetrazole, and 1-phenyl-5-ethoxycarbonylthiotetrazole, and mixtures of these sensitizers.

The added amount of the sensitizer is preferably 0.05 to 10 parts by weight, more preferably 0.1 to 10 parts by weight based on 100 parts by weight of the photosensitive organic compound B. When the added amount of the sensitizer is 0.1 part by weight or more based on 100 parts by weight of the photosensitive organic compound B, the light sensitivity is sufficiently improved. On the other hand, when the added amount of the sensitizer is 10 parts by weight or less based on 100 parts by weight of the photosensitive organic compound B, excessive absorption of light by the photopolymerization initiator particularly at the upper part of a coating film obtained by applying the photosensitive conductive paste is suppressed. As a result, the produced conductive pattern is inhibited from being reversely tapered to reduce adhesion to the substrate.

Examples of the epoxy resin C include glycidyl group-containing compounds that are epichlorohydrin-derived compounds, and unsaturated double bond adducts thereof. More specific examples include bisphenol A-type epoxy resins, bisphenol F-type epoxy resins, bisphenol S-type epoxy resins, phenol novolac-type epoxy resins, cresol novolac-type epoxy resins, biphenyl-type epoxy resins, hydrogenated bisphenol-type epoxy resins, bisphenol fluorene-type epoxy resins, biscresol fluorene-type epoxy resins, bisphenoxyethanol fluorene-type epoxy resins, glycidyl group-containing compounds such as sorbitol polyglycidyl ether, polyglycerol polyglycidyl ether, pentaerythritol polyglycidyl ether, diglycerol polyglycidyl ether, glycerol polyglycidyl ether, trimethylolpropane polyglycidyl ether, resorcinol diglycidyl ether, neopentyl glycol diglycidyl ether, 1,6-hexanediol diglycidyl ether, hydrogenated bisphenol A-type diglycidyl ether, ethylene glycol diglycidyl ether, polyethylene glycol diglycidyl ether, propylene glycol diglycidyl ether, polypropylene glycol diglycidyl ether, allyl glycidyl ether, 2-ethylhexyl glycidyl ether, phenyl glycidyl ether, polybutadiene diglycidyl ether, diglycidyl o-phthalate, hydroquinone diglycidyl ether, diglycidyl terephthalate, N-glycidyl phthalimide, and trimethylolpropane triglycidyl ether, and unsaturated double bond adducts such as acrylic acid adducts or mathacrylic acid adducts of these glycidyl group-containing compounds. The epoxy resin C is not completely freed of chlorine in the production process thereof, and thus chlorine ions are easily eluted under a high temperature and high humidity.

The added amount of the epoxy resin C is preferably 0.05 to 30 parts by weight, more preferably 0.5 to 20 parts by weight based on 100 parts by weight of the photosensitive organic compound B. When the added amount of the resin C containing an epoxy group is 0.05 parts by weight or more based on 100 parts by weight of the photosensitive organic compound B, the conductivity of the produced conductive pattern is improved. On the other hand, when the added amount of the epoxy resin C is 30 part by weight or less based on 100 parts by weight of the photosensitive organic compound B, pattern processability can be controlled.

The photosensitive conductive paste contains the ion adsorbent D. The photosensitive conductive paste has the ion adsorbent D as an essential constituent and, therefore, excessive ion components can be trapped to inhibit the above-mentioned adverse effects.

We found that in consideration of adhesion to a substrate, a specific ion adsorbent is selected as the ion adsorbent D to be added to adsorb excessive ions, particularly chlorine ions, which are contained in the photosensitive conductive paste.

Examples of the ion adsorbent include a variety of substances as described below. Examples as carbon-based powders include those of activated carbon, charcoal, acetylene black, ketjen black, carbon black, titanium black, carbon whiskers or carbon nanotubes, and graphite.

Examples as oxides include zinc oxide, tin oxide, indium oxide, calcium oxide, magnesium oxide, zirconium oxide, magnetic iron oxide, ferrite, alumina (aluminum oxide) represented by, for example, $Al_2O_3 \cdot xH_2O$, silica (silicon dioxide), titanium oxide, barium titanate, lead zirconate titanate, potassium titanate, cerium oxide and antimony oxide. These composite oxide systems and oxides may contain water.

Examples as composite oxide systems include those having magnesium oxide, aluminum oxide or silicon dioxide as a main constituent, such as magnesium oxide-aluminum oxide composite oxides ($2.5MgO \cdot Al_2O_3 \cdot xH_2O$ and $Mg_{0.7} \cdot Al_{0.3}O_{1.15}$), magnesium oxide-sodium oxide composite oxides ($Al_2O_3 \cdot Na_2O \cdot 2CO_3 \cdot xH_2O$), magnesium oxide-silicon dioxide composite oxides ($2MgO \cdot 6SiO_2 \cdot xH_2O$), and aluminum oxide-silicon dioxide composite oxides ($Al_2O_3 \cdot 9SiO_2 xH_2O$), and further include aluminosilicates commonly known as zeolites such as natural zeolite, synthetic zeolite, sodalites, natural mordenite, and synthetic mordenite. Examples as other composite oxide systems include minerals such as mica, synthetic mica, montmorillonite, vermiculite, talc, xonotlite, dawsonite, sericite, glass flakes, and clays.

Examples as borates include boric acid, zinc borate, and aluminum borate. Examples as sulfates include barium sulfate, molybdenum disulfide, basic magnesium sulfate, and magnesium sulfate.

Examples as phosphates include zirconium phosphate.

Examples as silicates include sepiolite, silica gel, wollastonite, silica balloons, glass balloons, shirasu balloons, magnesium silicate, and calcium silicate, and examples as hydroxides include aluminum hydroxide and magnesium hydroxide.

Examples as carbonates include calcium carbonate, magnesium carbonate, aluminum carbonate, zinc carbonate, boehmite, lithium carbonate, and $Al(OH)_3 \cdot NaHCO_3$.

Examples as hydrotalcites, namely carbonate minerals of magnesium and aluminum, include $Mg_{4.5}Al_2(OH)_{13}CO_3 \cdot 3.5H_2O$, $Mg_{4.5}Al_2(OH)_{13}CO_3$, $Mg_4Al_2(OH)_{12}CO_3 \cdot 3.5H_2O$, $Mg_6Al_2(OH)_{16}CO_3 \cdot 4H_2O$, $Mg_5Al_2(OH)_{14}CO_3 \cdot 4H_2O$, $Mg_6Al_2(OH)_{16}CO_3 \cdot 4H_2O$, $Mg_3Al_2(OH)_{10}CO_3 \cdot 1.7H_2O$, $Mg_3ZnAl_2(OH)_{12}CO_3 \cdot xH_2O$, and $Mg_3ZnAl_2(OH)_{12}CO_3$.

Examples as other substances include aluminum nitride, Teflon (registered trademark) powders, resin balloons, metal phthalocyanines, and PMFs (processed mineral fillers).

We found that it is preferred to select the ion adsorbent D from the group consisting of hydrotalcite magnesium oxide, aluminum oxide, aluminum hydroxide, magnesium hydroxide, magnesium carbonate, zirconium oxide, magnesium silicate, silicon dioxide, zeolite, and a carbon-based powder among the above-described substances in consideration of adhesion to a substrate. They may be used in combination.

It is more preferred to select the ion adsorbent D from the group consisting of hydrotalcite, magnesium oxide, aluminum oxide, aluminum hydroxide, magnesium hydroxide, magnesium carbonate, and a carbon-based powder among the above-described substances, and hydrotalcite is further preferred.

The shape of the ion adsorbent D may be any of a granular (particulate) shape, a polyhedral shape, a spherical shape, an irregular shape, a flat shape, and a needle shape, but it is preferred that the ion adsorbent D has a sharp particle size distribution, reduced aggregates and a spherical shape for smooth passage of exposure light.

The volume average particle size of the ion adsorbent D is preferably 0.03 to 10 μm, more preferably 0.1 to 6 μm. When the volume average particle size is 0.03 μm or more, dispersibility and dispersion stability in the photosensitive conductive paste are improved, and the surface area increases so that the ion adsorption effect is increased with respect to the added amount. On the other hand, when the volume average particle size is 10 μm or less, the surface smoothness, pattern accuracy, and dimensional accuracy of the produced conductive pattern are improved. The volume average particle size can be measured by a Coulter counter method.

When the added amount of the ion adsorbent D is 50% by weight or more based on the total solid content in the photosensitive conductive paste, it is difficult to obtain an intended effect of the photosensitive conductive paste. The added amount of the ion adsorbent D is preferably 0.1 to 20% by weight based on the total solid content. When the added amount of the ion adsorbent D is 0.1% by weight or more based on the total solid content, the ion adsorption ability is improved. On the other hand, when the added amount of the ion adsorbent D is 20% by weight or less based on the total solid content, influences on the conductivity of the produced conductive pattern are small.

The photosensitive conductive paste may contain a solvent. Examples of the solvent include N,N-dimethylacetamide, N,N-dimethylformamide, N-methyl-2-pyrrolidone, dimethyl imidazolidinone, dimethyl sulfoxide, γ-butyrolactone, ethyl lactate, 1-methoxy-2-propanol, 1-ethoxy-2-propanol, ethylene glycol mono-n-propyl ether, diacetone alcohol, tetrahydrofurfuryl alcohol, and propylene glycol monomethyl ether acetate, and mixtures of these solvents.

The photosensitive conductive paste may contain ion components such as chlorine ions. For example, when the photosensitive conductive paste contains a moderate amount of chlorine ions, the conductivity of the conductive film obtained is improved. On the other hand, when excessive ion components exist, adverse effects such as reduction of adhesion of the produced conductive pattern and degradation of a substrate and so on may occur, but the photosensitive conductive paste has the ion adsorbent D as an essential constituent, and therefore excessive ion components can be trapped to inhibit the above-mentioned adverse effects.

The photosensitive conductive paste may contain additives such as a resin, a plasticizer, a leveling agent, a surfactant, a silane coupling agent, an antifoaming agent, and a pigment.

Specific examples of the resin include novolac resins, phenol resins, polyimide precursors, ring-closed polyimides, melamine resins, polyvinyl chloride, and polyvinylidene chloride.

Examples of the plasticizer include dibutyl phthalate, dioctyl phthalate, polyethylene glycol, and glycerin.

Examples of the leveling agent include special vinyl-based polymers and special acryl-based polymers.

Examples of the silane coupling agent include methyltrimethoxysilane, dimethyldiethoxysilane, phenyltriethoxysilane, hexamethyldisilazane, 3-methacryloxypropyltrimethoxysilane, 3-glycidoxypropyltrimethoxysilane, and vinyltrimethoxysilane.

The photosensitive conductive paste is produced using, for example, a disperser or a kneader such as a three-roll mill, a ball mill, and a planetary ball mill.

A method of producing a conductive pattern using the photosensitive conductive paste will now be described. For producing the photosensitive conductive paste, first the photosensitive conductive paste is applied onto a substrate to obtain a coating film, and the obtained coating film is dried to volatilize a solvent. Thereafter, the dried coating film is exposed through a pattern forming mask, and the exposed coating film is developed to form a desired pattern on the substrate. The obtained pattern is then heated to obtain a conductive pattern.

Examples of the substrate include silicon wafers, ceramic substrates, and resin substrates. Examples of the ceramic substrate include glass substrates, alumina substrates, aluminum nitride substrates, and silicon carbide substrates, and examples of the resin substrate include epoxy resin substrates, polyether imide resin substrates, polyether ketone resin substrates, polysulfone-based resin substrates, polyimide films, polyester films, and aramid films.

Examples of the method of applying the photosensitive conductive paste onto the substrate include spin coating by a spinner, spray coating, roll coating, screen printing, and coating by a blade coater, a die coater, a calender coater, a meniscus coater, and a bar coater. The film thickness of the coating film obtained may be appropriately determined according to, for example, a coating method, or a total solid concentration or a viscosity of the photosensitive conductive paste, but the thickness after drying is preferably 0.1 to 50 μm. The thickness can be measured using a probe type step profiler such as "SURFCOM" (registered trademark) 1400 (manufactured by TOKYO SEIMITSU CO., LTD.). More specifically, the film thickness is measured at randomly selected three positions using a probe type step profiler (measurement length: 1 mm; scanning speed: 0.3 mm/sec), and an average value thereof is defined as a thickness.

Examples of the method of volatilizing and removing a solvent by drying the obtained coating film include heating/drying by an oven, a hot plate, an infrared ray or the like and vacuum drying. Preferably, heating/drying is performed at a temperature of 50 to 180° C. for 1 minute to several hours.

The dried coating film is exposed by a photolithography method. The light source for exposure is preferably the i ray (365 nm), the h ray (405 nm) or the g ray (436 nm) of a mercury lamp.

The exposed coating film is developed using a developer, and an unexposed part is dissolved and removed to obtain a desired pattern. Examples of the developer to be used for alkali development include aqueous solutions of tetramethylammonium hydroxide, diethanolamine, diethylaminoethanol, sodium hydroxide, potassium hydroxide, sodium carbonate, potassium carbonate, triethylamine, diethylamine, methylamine, dimethylamine, dimethylaminoethyl acetate, dimethylamino ethanol, dimethylaminoethyl methacrylate, cyclohexylamine, ethylenediamine, and hexamethylenediamine, and to these aqueous solutions may be added a polar solvent such as N-methyl-2-pyrrolidone, N,N-dimethylformamide, N,N-dimethylacetamide, dimethyl sulfoxide, and γ-butyrolactone, an alcohol such as methanol, ethanol, and isopropanol, an ester such as ethyl lactate and propylene glycol monomethyl ether acetate, a ketone such as cyclopentanone, cyclohexanone, isobutyl ketone, and methyl isobutyl ketone, or a surfactant.

Examples of the developer to be used for organic development include polar solvents such as N-methyl-2-pyrrolidone, N-acetyl-2-pyrrolidone, N,N-dimethylacetamide, N,N-dimethylformamide, dimethyl sulfoxide, and hexamethylphosphortriamide, and mixed solvents of these polar solvents and methanol, ethanol, isopropyl alcohol, xylene, water, methyl carbitol or ethyl carbitol. Even in the development described above, ion components may remain on the conductive pattern, but since the photosensitive conductive paste has the ion adsorbent D as an essential constituent, excessive ion components can be trapped to inhibit adverse effects such as reduction of adhesion of the produced conductive pattern and degradation of a substrate.

Examples of the development method include a method in which a developer is sprayed to a coating film surface while a substrate is left at rest or rotated, a method in which a substrate is immersed in a developer, and a method in which a substrate is immersed in a developer while an ultrasonic wave is applied thereto.

The pattern obtained by development may be subjected to a rinsing treatment with a rinsing liquid. Examples of the rinsing liquid include water, and aqueous solutions obtained by adding to water an alcohol such as ethanol and isopropyl alcohol, or an ester such as ethyl lactate and propylene glycol monomethyl ether acetate.

Examples of the method of heating the obtained pattern include heating/drying by an oven, an inert oven, a hot plate, an infrared ray or the like and vacuum drying. The heating temperature is preferably 100 to 300° C., more preferably 100 to 200° C. When the heating temperature is 100° C. or higher, the volume shrinkage amount of a resin increases so that the contact probability between conductive powders A increases, leading to a decrease in resistivity. Since high conductivity can be achieved by heating the photosensitive conductive paste at a relatively low temperature of 200° C. or lower, a conductive pattern can be formed on a material such as a substrate having low heat resistance.

A conductive pattern produced using the photosensitive conductive paste is suitably used as peripheral wiring for a touch panel. Examples of the type of touch panel include a resistive film type, an optical type, an electromagnetic induction type, and an electrostatic capacitance type, and the photosensitive conductive paste is more suitably used in the electrostatic capacitance type touch panel because this type of touch panel requires particularly fine wiring. In a touch panel including the conductive pattern as peripheral wiring of the touch panel, the peripheral wiring having a pitch (wiring width+inter-wiring width) of 100 μm or less, the frame width can be decreased to widen a view area.

EXAMPLES

Our pastes, substrates, and methods will be described below more in detail by way of examples and comparative examples. Materials used in examples and comparative examples are as follows.

Photosensitive Organic Compound B

Synthesis Example 1: Photosensitive Organic Compound B-1

Compound obtained by addition reaction of 5 parts by weight of glycidyl methacrylate (GMA) with a copolymer of ethyl acrylate (EA)/2-ethylhexyl methacrylate (2-EHMA)/ styrene (St)/acrylic acid (AA) (copolymerization ratio: 20 parts by weight/40 parts by weight/20 parts by weight/15 parts by weight)

150 g of diethylene glycol monoethyl ether acetate was added in a reaction vessel in a nitrogen atmosphere, and the temperature was elevated to 80° C. using an oil bath. To this was added dropwise for 1 hour a mixture including 20 g of ethyl lactate, 40 g of 2-ethylhexyl methacrylate, 20 g of styrene, 15 g of acrylic acid, 0.8 g of 2,2'-azobisisobutyronitrile and 10 g of diethylene glycol monoethyl ether acetate. After completion of the dropwise addition, further a polymerization reaction was carried out for 6 hours. Thereafter, 1 g of hydroquinone monomethyl ether was added to stop the polymerization reaction. Subsequently, a mixture including 5 g of glycidyl methacrylate, 1 g of triethyl benzyl ammonium chloride and 10 g of diethylene glycol monoethyl ether acetate was added dropwise for 0.5 hours. After completion of the dropwise addition, an addition reaction was carried out for 2 hours. The obtained reaction solution was refined with methanol to remove unreacted impurities, and dried under vacuum for 24 hours to obtain a photosensitive organic compound B-1.

Synthesis Example 2: Photosensitive Organic Compound B-2

Compound obtained by addition reaction of 5 parts by weight of glycidyl methacrylate (GMA) with a copolymer of ethylene oxide-modified bisphenol A diacrylate FA-324A (manufactured by Hitachi Chemical Co., Ltd.)/EA/AA (copolymerization ratio: 50 parts by weight/10 parts by weight/ 15 parts by weight)

150 g of diethylene glycol monoethyl ether acetate was added in a reaction vessel in a nitrogen atmosphere, and the temperature was elevated to 80° C. using an oil bath. To this was added dropwise for 1 hour a mixture including 50 g of ethylene oxide-modified bisphenol A diacrylate FA-324A, 20 g of ethyl acrylate, 15 g of acrylic acid, 0.8 g of 2,2'-azobisisobutyronitrile and 10 g of diethylene glycol monoethyl ether acetate. After completion of the dropwise addition, further a polymerization reaction was carried out for 6 hours. Thereafter, 1 g of hydroquinone monomethyl ether was added to stop the polymerization reaction. Subsequently, a mixture including 5 g of glycidyl methacrylate, 1 g of triethyl benzyl ammonium chloride and 10 g of diethylene glycol monoethyl ether acetate was added dropwise for 0.5 hours. After completion of the dropwise addition, an addition reaction was carried out for 2 hours. The obtained reaction solution was refined with methanol to remove unreacted impurities, and dried under vacuum for 24 hours to obtain a photosensitive organic compound B-2.

Photopolymerization Initiator

IRGACURE (registered trademark) 369 (manufactured by Ciba Japan K.K.) Solvent

Diethylene glycol monobutyl ether (manufactured by Tokyo Chemical Industry Co., Ltd.)

Conductive Particles A

Ag particles produced by a wet reduction method (volume average particle size: 1.19 μm; specific surface area: 1.12 $m^2/g$; tap density: 4.8 $g/cm^3$)

Ion Adsorbent D

D-1: Hydrotalcite DHT-4A ($Mg_{4.5}Al_2(OH)_{13}CO_3.5H_2O$ manufactured by Kyowa Chemical Industry Co., Ltd.)

D-2: Magnesium oxide-aluminum oxide composite oxide "KYOWAAD" (registered trademark) 2000 ($Mg_{0.7}Al_{0.3}O_{1.15}$ manufactured by Kyowa Chemical Industry Co., Ltd.)

D-3: Magnesium oxide (manufactured by Kyowa Chemical Industry Co., Ltd.)

D-4: Activated carbon powder (Cas No. 7440-44-0 manufactured by Tokyo Chemical Industry Co., Ltd.)

D-5: Zirconium phosphate (manufactured by KCM Corporation)

Epoxy Resin C-1

Epoxy Ester 80 MFA (manufactured by KYOEISHA CHEMICAL Co., Ltd.; total chlorine content: 300 ppm or more)

Example 1

20 g of the photosensitive organic compound B-1, 4 g of Epoxy Ester 80 MFA, 12 g of N-n-butoxymethylacrylamide and 4 g of "IRGACURE" (registered trademark) 369 and 10 g of diethylene glycol monobutyl ether were added in a 100 mL bottle, and mixed by a rotating and revolving mixer (hybrid mixer) "Awatori Rentaro" (registered trademark) (ARE-310 manufactured by THINKY CORPORATION) to obtain a photosensitive resin solution. Ag particles and the ion adsorbent D-1 were mixed with the obtained photosensitive resin solution so that the content (% by weight) of each component would be as shown in Table 1, and the mixture was kneaded using a three-roll mill (EXAKT M-50 manufactured by EXAKT) to obtain a photosensitive conductive paste. The obtained photosensitive conductive paste was evaluated for the following items. The evaluation results are shown in Table 1.

Evaluation of Processability

The photosensitive conductive paste was applied onto a PET film having a film thickness of 50 μm by a screen printing method, and the obtained coating film was dried in a drying oven at 100° C. for 10 minutes. The dried coating film was exposed via a photomask having nine units having different L/S values, with one unit including a group of lines arranged with a fixed line-and-space (hereinafter, referred to as L/S), namely a light transmission pattern, and developed to obtain patterns having different L/S values. Thereafter, the obtained nine patterns were each cured in a drying oven at 140° C. for 30 minutes to obtain conductive patterns having different L/S values. The L/S values of the units of the photomask were set to 500/500, 250/250, 100/100, 50/50, 40/40, 30/30, 25/25, 20/20, 17/17, 15/15 and 10/10 (each showing a line width (μm)/interval (μm)). The obtained conductive pattern was observed with an optical microscope to confirm a pattern which was free from residues between patterns and free from pattern peeling and had the smallest L/S value, and the L/S value was defined as a development-enabling L/S value. At this time, conductive patterns having a development-enabling L/S value of 30/30, 25/25, 20/20, 17/17, 15/15 or 10/10 were rated "⊙", conductive patterns having a development-enabling L/S value of 100/100, 50/50 or 40/40 were rated "○", and conductive patterns having a development-enabling L/S value of 500/500 or 250/250 were rated "x". Exposure was performed over the entire line at an exposure amount of 200 mJ/cm$^2$ (in terms of a wavelength of 365 nm) using exposure equipment (PEM-6M manufactured by UNION OPTICAL CO., LTD.), and development was performed by immersing a substrate in a 0.25 wt % aqueous Na$_2$CO$_3$ solution for 30 seconds, and then subjecting the substrate to a rinsing treatment with ultrapure water.

As a result, the conductive pattern had a development-enabling L/S value of 20/20 μm, and was thus rated "⊙", and it was confirmed that proper pattern processing was performed.

Evaluation of Adhesion to Substrate

The photosensitive conductive paste was applied onto a PET film with ITO "ELECRYSTA" (registered trademark) V270L-TFS (manufactured by NITTO DENKO CORPORATION) by a screen printing method so that a coating film had a film thickness of 7 μm after drying, and the obtained coating film was dried in a drying oven at 90° C. for 10 minutes, and then exposed over the entire surface thereof. Conditions for exposure were the same as those in the evaluation of processability described above. Thereafter, the coating film was heated in a drying oven at 140° C. for 1 hour, and a cut was then made in the form of 10×10 squares with a width of 1 mm. A cellophane tape (manufactured by NICHIBAN CO., LTD.) was attached at the entire location of the squares of the sample and peeled off, and initial evaluation was performed by counting a number of remaining squares. Subsequently, the sample was placed in a thermo-hygrostat bath SH-661 (manufactured by ESPEC Corp.) at 85° C. and 85% RH for 240 hours and taken out, a cellophane tape was attached at the entire location of the squares of the sample and peeled off, and evaluation after placement in the thermo-hygrostat bath was performed by counting a number of remaining squares. In both the initial evaluation and the evaluation after placement in the thermo-hygrostat bath, samples with the number of remaining squares being 95 or more were rated "⊙", samples with the number of remaining squares being 70 or more and less than 95 were rated "○", and samples with the number of remaining squares being less than 70 were rated "x".

Method of Measuring Total Chlorine Content 50 g of the photosensitive conductive paste was added in a table top centrifuge (2420 manufactured by KUBOTA Corporation), and centrifugally separated at 3000 rpm for 30 minutes. A supernatant solution after centrifugal separation was dried at 150° C. for 10 hours, then diluted by 100 times, and filtrated with a solid layer extracting cartridge (GL-PaKPLS-3 manufactured by GL Sciences Inc.), and a total chlorine content was measured for the resulting filtrate using a chlorine/sulfur analyzer (TOX-2100H manufactured by Mitsubishi Chemical Analytech Co., Ltd.).

Examples 2 to 8

Photosensitive conductive pastes having the compositions shown in Table 1 were produced in the same manner as in Example 1. Evaluation results are also shown in Table 1.

Comparative Examples 1 to 3

Photosensitive conductive pastes having the compositions shown in Table 1 were produced in the same manner as in Example 1. Evaluation results are also shown in Table 1.

TABLE 1

| | Composition of paste | | | | | | | Evaluation results | | |
|---|---|---|---|---|---|---|---|---|---|---|
| | Inorganic particles (A) | | Photosensitive organic compound (B) | Epoxy resin (C) | | Ion adsorbent powder (D) | | | Evaluation of adhesion | |
| | Content in paste (% by weight) | Type | Type | Type | Added amount based on 100 parts by weight of (B) (parts by weight) | Type | Content in paste (% by weight) | Evaluation of processability Assessment | Initial | After placement in thermo-hygrostat bath (85° C./85 RH %) |
| Example 1 | 87 | Ag | B-1 | C-1 | 20 | D-1 | 1.0 | ⊙ | ⊙ | ⊙ |
| Example 2 | 87 | Ag | B-1 | C-1 | 20 | D-2 | 1.0 | ⊙ | ⊙ | ○ |
| Example 3 | 87 | Ag | B-1 | C-1 | 20 | D-3 | 1.0 | ⊙ | ⊙ | ○ |

TABLE 1-continued

| | Composition of paste | | | | | Ion adsorbent powder (D) | | Evaluation results | | |
|---|---|---|---|---|---|---|---|---|---|---|
| | Inorganic particles (A) | | Photosensitive organic compound (B) Type | Epoxy resin (C) | | | | | Evaluation of adhesion | |
| | Content in paste (% by weight) | Type | | Type | Added amount based on 100 parts by weight of (B) (parts by weight) | Type | Content in paste (% by weight) | Evaluation of processability Assessment | Initial | After placement in thermo-hygrostat bath (85° C./85 RH %) |
| Example 4 | 87 | Ag | B-1 | C-1 | 20 | D-4 | 1.0 | ⊙ | ⊙ | ○ |
| Example 5 | 87 | Ag | B-2 | C-1 | 20 | D-1 | 1.0 | ⊙ | ⊙ | ⊙ |
| Example 6 | 87 | Ag | B-2 | C-1 | 20 | D-2 | 1.0 | ⊙ | ⊙ | ○ |
| Example 7 | 87 | Ag | B-2 | C-1 | 20 | D-3 | 1.0 | ⊙ | ⊙ | ○ |
| Example 8 | 87 | Ag | B-2 | C-1 | 20 | D-4 | 1.0 | ⊙ | ⊙ | ○ |
| Comparative Example 1 | 87 | Ag | B-1 | C-1 | 20 | None | 1.0 | ○ | ○ | X |
| Comparative Example 2 | 87 | Ag | B-2 | C-1 | 20 | None | 1.0 | ○ | ○ | X |
| Comparative Example 3 | 87 | Ag | B-2 | C-1 | 20 | D-5 | 1.0 | ○ | ○ | X |

INDUSTRIAL APPLICABILITY

The photosensitive conductive paste can be suitably used for producing a conductive pattern such as peripheral wiring for a touch panel.

The invention claimed is:

1. A photosensitive conductive paste comprising:
   conductive particles A;
   a photosensitive organic compound B;
   an epoxy resin C; and
   an ion adsorbent D selected from the group consisting of hydrotalcite, aluminum hydroxide, magnesium hydroxide, magnesium carbonate, magnesium silicate, zeolite, and a carbon-based powder.

2. The photosensitive conductive paste according to claim 1, wherein the conductive particles A are noble metal particles.

3. A multilayer substrate including a conductive layer formed from the photosensitive conductive paste according to claim 2.

4. A method of producing a conductive pattern comprising:
   applying the photosensitive conductive paste according to claim 2 onto a substrate to obtain a coating film;
   drying the coating film;
   exposing the dried coating film;
   developing the exposed coating film to obtain a pattern; and
   heating the pattern to obtain a conductive pattern.

5. An electrostatic capacitance type touch panel including as peripheral wiring the conductive pattern formed from the photosensitive conductive paste according to claim 2, wherein the peripheral wiring has a pitch of 100 μm or less.

6. A multilayer substrate including a conductive layer formed from the photosensitive conductive paste according to claim 1.

7. A method of producing a conductive pattern comprising:
   applying the photosensitive conductive paste according to claim 1 onto a substrate to obtain a coating film;
   drying the coating film;
   exposing the dried coating film;
   developing the exposed coating film to obtain a pattern; and
   heating the pattern to obtain a conductive pattern.

8. An electrostatic capacitance type touch panel including as peripheral wiring the conductive pattern formed from the photosensitive conductive paste according to claim 1, wherein the peripheral wiring has a pitch of 100 μm or less.

9. A photosensitive conductive paste comprising:
   conductive particles A;
   a photosensitive organic compound B;
   an epoxy resin C; and
   an ion adsorbent D selected from the group consisting of hydrotalcite powder, and a carbon-based powder.

10. The photosensitive conductive paste according to claim 9, wherein the conductive particles A are noble metal particles.

11. A multilayer substrate including a conductive layer formed from the photosensitive conductive paste according to claim 10.

12. A method of producing a conductive pattern comprising:
   applying the photosensitive conductive paste according to claim 10 onto a substrate to obtain a coating film;
   drying the coating film;
   exposing the dried coating film;
   developing the exposed coating film to obtain a pattern; and
   heating the pattern to obtain a conductive pattern.

13. An electrostatic capacitance type touch panel including as peripheral wiring the conductive pattern formed from the photosensitive conductive paste according to claim 10, wherein the peripheral wiring has a pitch of 100 μm or less.

14. A multilayer substrate including a conductive layer formed from the photosensitive conductive paste according to claim 9.

15. A method of producing a conductive pattern comprising:
   applying the photosensitive conductive paste according to claim 9 onto a substrate to obtain a coating film;
   drying the coating film;
   exposing the dried coating film;
   developing the exposed coating film to obtain a pattern; and
   heating the pattern to obtain a conductive pattern.

16. An electrostatic capacitance type touch panel including as peripheral wiring the conductive pattern formed from the photosensitive conductive paste according to claim 9, wherein the peripheral wiring has a pitch of 100 μm or less.

17. A photosensitive conductive paste comprising:
conductive particles A;
a photosensitive organic compound B;
an epoxy resin C; and
dispersing ion adsorbent D selected from the group consisting of hydrotalcite, magnesium oxide, aluminum oxide, aluminum hydroxide, magnesium hydroxide, magnesium carbonate, zirconium oxide, magnesium silicate, silicon dioxide, zeolite, and a carbon-based powder,
wherein a volume average particle size of the ion adsorbent D is 0.1 to 6 µm and an amount of the ion adsorbent D is 0.1 to 20% by weight based on the total solid content.

18. A photosensitive conductive paste comprising:
conductive particles A;
a photosensitive organic compound B;
an epoxy resin C,
an ion adsorbent D selected from the group consisting of hydrotalcite, magnesium oxide, aluminum oxide, aluminum hydroxide, magnesium hydroxide, magnesium carbonate, zirconium oxide, magnesium silicate, silicon dioxide, zeolite, and a carbon-based powder; and
chlorine ions.

* * * * *